(12) United States Patent
Watanabe et al.

(10) Patent No.: US 6,666,082 B2
(45) Date of Patent: Dec. 23, 2003

(54) THERMAL AIRFLOW SENSOR

(75) Inventors: Izumi Watanabe, Hitachinaka (JP); Masamichi Yamada, Hitachinaka (JP); Keiichi Nakada, Hitachinaka (JP)

(73) Assignees: Hitachi, Ltd., Tokyo (JP); Hitachi Car Engineering Co., Ltd., Hitachinaka (JP)

( * ) Notice: Subject to any disclaimer, the term of this patent is extended or adjusted under 35 U.S.C. 154(b) by 0 days.

(21) Appl. No.: 10/096,570

(22) Filed: Mar. 14, 2002

(65) Prior Publication Data

US 2002/0092349 A1 Jul. 18, 2002

Related U.S. Application Data

(63) Continuation of application No. 09/607,950, filed on Jun. 30, 2000, now abandoned.

(30) Foreign Application Priority Data

Jun. 30, 1999 (JP) .......................................... 11-184771

(51) Int. Cl.[7] ................................................ G01F 1/68
(52) U.S. Cl. .................................. 73/204.22; 73/204.26
(58) Field of Search ........................ 73/204.26, 204.24, 73/204.22, 202.5, 204.11

(56) References Cited

U.S. PATENT DOCUMENTS

| | | | | | |
|---|---|---|---|---|---|
| 3,931,736 | A | * | 1/1976 | Olmstead | 73/204.19 |
| 4,888,988 | A | * | 12/1989 | Lee et al. | 73/204.26 |
| 5,271,272 | A | * | 12/1993 | Hueftle et al. | 73/118.2 |
| 5,353,638 | A | * | 10/1994 | Marek | 216/16 |
| 5,423,212 | A | * | 6/1995 | Manaka | 73/204.26 |
| 5,644,079 | A | | 7/1997 | Billing et al. | 73/204.22 |
| 6,176,131 | B1 | * | 1/2001 | Hecht et al. | 73/204.26 |

FOREIGN PATENT DOCUMENTS

| | | |
|---|---|---|
| EP | 0 908 703 | 4/1999 |
| GB | 2 179 161 | 2/1987 |
| WO | WO 97/21986 | 6/1997 |

\* cited by examiner

Primary Examiner—Edward Lefkowitz
Assistant Examiner—Corey D. Mack
(74) Attorney, Agent, or Firm—Crowell & Moring LLP

(57) ABSTRACT

A thermal airflow sensor is made highly resistant to thermal stresses due to cold-heat cycles, highly reliable even in the presence of corrosive gases, and capable of low dispersion of output characteristics. The thermal airflow sensor has a semiconductor sensor element in a dent formed on a ceramic laminated board on which a control circuit and a metallic film are formed. The laminated board area at which the semiconductor sensor element is electrically connected to the laminated board is covered with epoxy resin. The part covered with epoxy resin is placed in the air passage.

19 Claims, 10 Drawing Sheets

THERMAL AIRFLOW SENSOR

This application is a continuation of application Ser. No. 09/607,950, filed Jun. 30, 2000 now abandoned.

FIELD OF THE INVENTION

The present invention relates to a thermal airflow sensor, more particularly to a thermal airflow sensor for measuring flow rates of air intake in an internal combustion engine.

DESCRIPTION OF THE PRIOR ART

Conventionally, a thermal air-flow rate measuring device has been used widely as an airflow sensor in the air intake passage of an internal combustion engine for automobiles and the like because this type of air-flow rate measuring device can directly detect mass airflow rates. Particularly, up-to-date air-flow rate measuring devices fabricated by a semiconductor micro-machining technology have quick responses by which the air-flow rate measuring devices are also expected to be available to detect reverse flows of air in internal combustion engines.

For example, an embodiment which uses a thermal air-flow rate measuring sensor comprising a conventional semiconductor board has been disclosed in Japanese Non-examined Patent Publication No.9-503312 (1997). In this embodiment, the sensor element is supported by a metallic casing and the circuit board is housed in the casing. The semiconductor sensor element is electrically connected to the board by metallic wires.

However, this prior art has some problems to be solved. First, although the metallic casing containing a semiconductor sensor element and a control circuit board can increase the radio-noise resistance, the casing may have cracks at joints between the metallic casing and the silicone semiconductor sensor element when cold-hot cycles are applied repeatedly because their thermal expansion coefficients are greatly different. Second, as the metallic casing has a comparatively high heat conductivity, the engine heat will easily attack the semiconductor sensor element through the passage and the other components, which makes the characteristics of the sensor unstable. Further, the metallic casing has a complicated structure as illustrated in FIG. 5, Japanese Non-examined Patent Publication No.9-503312 (1997), which makes the product dispersed and expensive.

Furthermore, when the metallic casing is so constructed to be exposed to air in the passage of the engine room, the casing will be easily corroded under a severe environmental condition and the characteristics of the sensor may vary. Additionally, as the semiconductor sensor element in the casing is provided separately from the control circuit board, the number of parts to be assembled increases and consequently, the manufacturing cost becomes higher. Finally, as wires connecting the control circuit and the semiconductor sensor element must be provided in a module of this embodiment for assurance of reliability, the sensor may detect air disturbance caused by the passage wall and makes output noises greater, which makes the precision of the sensor unstable. (The semiconductor sensor element must be preferentially located away from the walls of the subsidiary walls.)

SUMMARY OF THE INVENTION

The main purpose of the present invention is to solve the above problems of the prior art and provide a high-reliability and low-production cost thermal airflow sensor almost free from characteristics errors.

A thermal airflow sensor for solving the above problems comprises a semiconductor sensor element having a measuring part which comprises a thermoresistor formed on a semiconductor board and a heating resistor formed on the thinner part of said semiconductor board in a dent formed on a laminated ceramic board and a control circuit which controls the intensity of a current to said heating resistor to make said heating resistor hotter by a preset temperature than said thermoresistor and gets an airflow signal indicating the flowrate of air in said laminated ceramic board. The dent can be provided by placing a punched board on a non-punched board.

Further, to increase the radio-noise resistance, a metallic plate separately from said control circuit is provided in said laminated ceramic board and grounded together with said control circuit. Said semiconductor sensor element and said control circuit are electrically connected by wire bonding and the wire-bonded part is covered with epoxy resin for protection. Said semiconductor sensor element and said resin-covered wire-bonded part are placed in the air passage to be in direct contact with airflows.

In accordance with the present invention, the thermal expansion coefficient of the laminated ceramic board is approximately equal to that of the semiconductor sensor element. This means that the sensor is very resistive to thermal stresses such as cold-hot cycles. Further, this ceramic sensor will not be corroded under such severe environmental conditions in the engine room. Further, as the control circuit and a metallic film for shielding electromagnetic waves are housed in the laminated ceramic board, the sensor product can have fewer parts. This improves the workability of the sensor products, makes the sensor products compacter and cheaper. Further, the dent in the laminated board can be provided just by placing a punched board on a non-punched board and requires no other processes such as bending. This means provision of high-precision low-cost dents.

The thermal airflow sensor in accordance with the present invention is free from disconnection and corrosion of wires which electrically connect the control circuit and the semiconductor sensor element because the wire-bonding part is wholly covered with epoxy resin for protection. Therefore, the wire-bonding part can be placed in the air passage and consequently, the semiconductor sensor element can be placed away from the walls of the subsidiary passage. This can suppress output noises and stabilize the output characteristics.

Further, as the semiconductor sensor element is not on the wall of the subsidiary passage, an engine heat through the wall of the passage will be hardly transferred to the semiconductor sensor element. Similarly, the heat conductivity of the laminated ceramic board is smaller than that of metal and the heat attack on the semiconductor sensor element is diminished. This can protect the sensor against change in characteristics by heat.

DETAILED DESCRIPTION OF THE PREFERRED INVENTION

Below will be explained some embodiments in accordance with the present invention referring to drawings.

Figure 1:
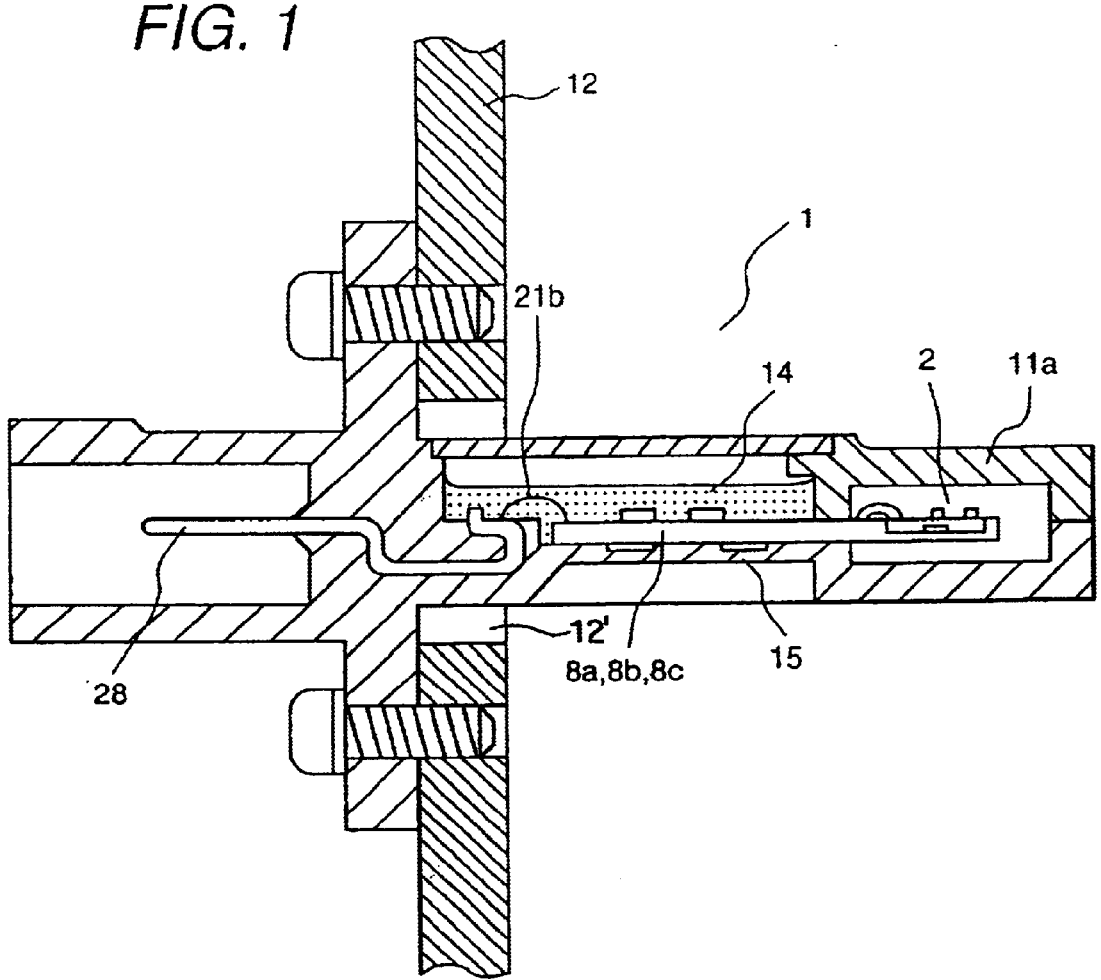
FIG. 1 is a sectional representation of the thermal airflow sensor in accordance with the present invention which has a semiconductor sensor element on a laminated board.
Figure 2:
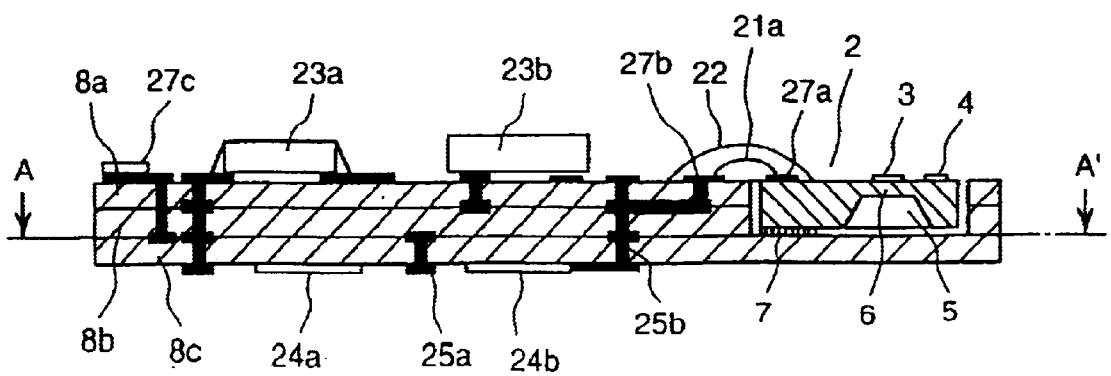
FIG. 2 is a fragmentary sectional representation of the thermal airflow sensor in accordance with the present invention which has a control circuit on a laminated board and a semiconductor sensor element in a dent of the laminated board.

FIG. 1 is a sectional representation of the thermal airflow sensor 1 which is a first embodiment of the present invention. FIG. 2 is a sectional view of a circuit board containing a sensor part of the thermal airflow sensor 1 shown in FIG. 1.

In FIG. 1 and FIG. 2, the thermal airflow sensor 1 comprises a semiconductor sensor element 2, laminated boards 8a, 8b, and 8c which support the semiconductor sensor element 2, a subsidiary passage 11a, and a metallic terminal 28 connected to the boards by connecting wire 21b for transferring signals to and from the outside. The semiconductor sensor element 2 comprises a cavity 5 formed by anisotropic etching between the bottom of a semiconductor board such as silicone and the boundary surface of an electrically-insulated diaphragm 6, a heating resistor 3 formed on the diaphragm 6 (lean part) over the cavity 5, a thermoresistor formed on the semiconductor board to measure the temperature of air, and electrodes 27a and 27b which connect said resistors to a control circuit 16. The control circuit controls a current applied to said heating resistor 3 to make said heating resistor 3 hotter by a preset temperature than said thermoresistor 4 and gets an airflow signal indicating the flow rate of air.

As illustrated in FIG. 2, the thermal airflow sensor 1 in accordance with the present invention has a semiconductor sensor element 2 cemented to the laminated board 8c in the dent of the laminated ceramic boards 8a, 8b, and 8c (with the sensor cement 7). In this case, the top surface of the diaphragm 6 of the semiconductor sensor element 2 must be approximately as high as the top surface of the laminated board 8. This can be set by adjusting the depth of the dent in the laminated boards 8a and 8b. If the top surface of the diaphragm 6 of the semiconductor sensor element 2 is not as high as the top surface of the laminated board 8, the air flow is disturbed and becomes unstable. Consequently, the output characteristics of the thermal airflow sensor becomes unstable. This will be explained in detail referring to FIG. 6 and FIG. 7.

One of the features of the thermal airflow sensor using the laminated ceramic boards 8a, 8b, and 8c is that the depth of the dent can be set freely when they are formed. Below will be explained how the ceramic boards, for example 8a, 8b, and 8c, are fabricated and laminated together. First, green sheet-like ceramic boards 8a and 8b of 0.1 mm to 0.3 mm thick are placed on another green sheet-like ceramic board 8c of 0.1 mm to 0.3 mm thick and pressed together. In this case, the ceramic boards 8a and 8b are punched out in advance to have a hole for the semiconductor sensor element. This pile of ceramic boards is burnt to combine the boards. With this, a laminated ceramic board 8a, 8b, and 8c having a dent on it is completed. As the ceramic green sheets shrink 10% to 30% when they are burnt, they must be a little thicker than the thickness of the burnt sheet. This thickness of ceramic sheet is determined experimentally. The dent which is formed in this way has a flat bottom and the dent wall is perpendicular to the bottom unlike, for example, a press-formed dent whose bottom periphery is round. This can make the bottom of the semiconductor sensor element 2 steadily close-contact with the top surface of the laminated board 8c and reduce the dispersion in the output characteristics of the thermal airflow sensor. Further, unlike a structure disclosed in Japanese Non-examined Patent Publication No.9-503312 (1997) which is complicated and has bent parts, this simple laminated boards 8a, 8b, and 8c are easily manufactured and inexpensive because they require only laminating and burning.

Further, the semiconductor sensor element 2 is made of a semiconductor such as silicone and its thermal expansion coefficient is very smaller than that of metallic material such as brass, copper, nickel, and aluminum. Therefore, if the semiconductor sensor element 2 is connected to a metallic board, the difference in their thermal expansion coefficients may cause thermal fatigue of the materials and, in worst cases, may cause cracks in their joint in cold-hot cycles and the like. Some experiments have showed us that the heating resistor 3 and the thermoresistor 4 on the surface of the semiconductor sensor element 2 warped and the resulting stress causes their resistances to vary. Further, metallic materials in the engine room would be easily corroded by sulfurous gas, nitrogen oxide gas, etc. under severe environmental conditions. Further, the product of corrosion disturbs the flow of air and varies the output characteristics of the semiconductor sensor element.

These problems can be solved by the use of high corrosion-resistance laminated ceramic boards 8a, 8b, and 8c whose thermal expansion coefficient is approximately equal to that of the semiconductor sensor element 2. If the semiconductor sensor element 2 is placed on a metallic material, the heat from the engine transfers to the housing 15 and the metallic board quickly through the passage 12' of the wall 12 and finally to the semiconductor sensor element 2 because the thermal expansion coefficient of the metallic material is very small. As the result, the thermoresistor formed on the semiconductor sensor element 2 becomes hotter than the air which actually flows through the passage. This causes the output characteristics of the semiconductor sensor element to vary. Therefore, high heat-conductivity ceramic material such as beryllium and silicon carbide is not good for the laminated ceramic boards 8a, 8b, and 8c.

Preferable ceramic materials are alumina, mixture of alumina and glass, zirconium zirconia, silicon nitride, alumina nitride, and so on. Particularly, judging from a point of cost performance, aluminum or a mixture of alumina and glass is most preferable. Further, alumina material is stronger than a mixture of alumina and glass. Contrarily, the mixture of alumina and glass has a very small heat conductivity (because of glass component) and has the advantage of alumina material in thermal performance.

The other advantage of using ceramic materials is hard to cause condensation in comparison to the use of metallic materials.

In other words, ceramic materials are smaller in heat capacity than metallic materials of the identical volume and their temperature is apt to follow the surrounding temperature.

For example, when a hot and damp air comes into the cold semiconductor sensor element 2 and its vicinity in the intake pipe, water in the air may condense on the surface of the semiconductor sensor element 2 if the material is slow to follow the surrounding temperature. Water drops on the semiconductor sensor element 2 in operation will cause the sensor to malfunction. In extreme cases, the diaphragm 6 of the semiconductor sensor element 2 may be damaged by a heat shock.

Also to solve this problem, the use of laminated ceramic boards 8a, 8b, and 8c is preferable.

Further, another advantage of using the laminated boards 8a, 8b, and 8c is that circuit patterns can be printed on the top surface, the bottom surface, or both of the laminated boards 8a, 8b, and 8c. The embodiment in FIG. 2 shows how the circuit pattern is printed. In FIG. 2, a circuit pattern for electric parts 23a and 23b and electrodes 27a and 27b which are used to connect the semiconductor sensor element 2 to a control circuit 16 with wires 27a and 27b is printed on the surface of the upper board 8a. The circuit pattern on the board 8a is partially connected to the circuit pattern formed on the intermediate board 8b by through-holes 25a and 25b. The intermediate board 8b has circuit patterns and through-holes 25a and 25b to connect the pattern of the upper board 8a to the resistor films 24a and 24b printed on the bottom of the lower board 8c.

As the control circuit 16 and the semiconductor sensor element 2 are assembled in a body, the thermal airflow sensor can be made compacter and they can be connected to the housing 15 by a single step. This can reduce the assembling cost of the thermal airflow sensor. One of the main features of the present invention is that the control circuit 16 and the semiconductor sensor element 2 are placed on an identical plane and the characteristics of the sensor can be adjusted on the board before they are connected to the housing and so on. Further, with the use of an adequate control means, the flow characteristics of the semiconductor sensor element can also be controlled and characteristic errors can be selected on the boards. With this, great cost reduction can be expected.

The semiconductor sensor element 2 is too small (approx. 2 mm by 6 mm by 0.3 mm) to be handled. However, when mounted on the laminated ceramic boards 8a, 8b, and 8c together with the control circuit 16, the semiconductor sensor element 2 can be easily handled. After cemented to the housing 15, the semiconductor sensor element 2 can be exactly mounted in the subsidiary passage 11a. Therefore, the output characteristics of the thermal airflow sensor can also be assured.

The other effect of this embodiment is high radio-noise resistance.

In automobiles, electronic parts are required to have high radio-noise resistances. Recent automobiles have a tendency to contain more electronic and electric parts and require them to be high resistant to radio noises. As for a thermal airflow sensor 1, it is well-known that the longer wires connecting the sensor 1 and the control circuit 16 will receive more electromagnetic noises. When the sensor part and the control circuit 16 are assembled in a body as stated in the present invention, the wires connecting the sensor and the control circuit can be printed shortest. Consequently, the sensor will not be affected at all by electromagnetic noises coming from the outside. Therefore, the thermal airflow sensor can have a higher radio-noise resistance.

Figure 3:
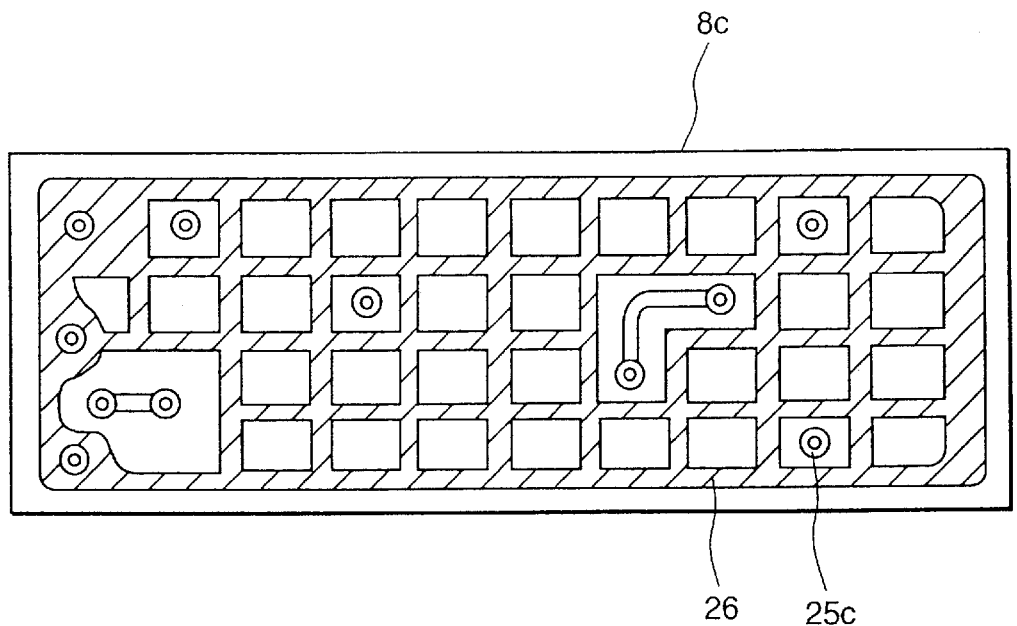
FIG. 3 is a metallic circuit pattern formed inside the laminated board on which the semiconductor sensor element in accordance with the present invention is mounted.

FIG. 3 shows a plane view of the laminated board along the line A–A', illustrating a structure for increasing the radio-noise resistance of the thermal airflow sensor. A grid-like metallic sheet 26 containing silver-platinum or silver palladium alloy is formed on the surface of the laminated board 8c under the control circuit 16 and grounded to the control circuit 16. Although the metallic sheet in FIG. 3 is formed grid-like, this pattern can be printed on the whole surface of the lowest laminated board without reducing the performance to protect the control circuit from electromagnetic noises. With this pattern, the thermal airflow sensor can go without any metallic shield to protect the circuit against electromagnetic noises. This also leads to the cost reduction of the sensor products.

Although the aforesaid embodiment uses laminated ceramic boards 8a, 8b, and 8c, the ceramic boards are easy to be broken. So we studied whether the ceramic boards can be substituted by resin boards.

The thermal airflow sensor 1 for automobile whose sensor part must be placed in the intake pipe is required to be highly resistant to heat, gasoline vapor, engine oil or corrosion by sulfurous gas, nitrogen oxide gas, etc. in the blow-by gas, and also required to have high thermal insulation and low thermal expansion coefficients. Therefore, ordinary phenol resin boards (for printed circuit boards) and metal-base boards including a metallic sheet such as an aluminum sheet in the laminated board are not available judging from heat resistance, environment resistance, and heat conductivity.

So, we studied to use polyimide resin for laminated boards because it has excellent heat resistance, environment resistance, and heat conductivity. However, the polyimide resin is too soft to retain a stable board form and we gave up the polyimide resin. After long and profound studies and experiments, we found that polyimide fibers impregnated with epoxy resin which is hard, low in thermal expansibility, and high in environment resistance are fit for laminated boards 8a, 8b, and 8c. These resin boards can be built up as shown in FIG. 1, FIG. 2, and FIG. 3. However, as the thermal resistance of the resin boards is 350° C. which is lower than that of ceramic boards, metallic pastes including low-enameled resins must be used for wire-printing. The main features of this resin laminated board 8a, 8b, and 8c are that the resin laminated board is less breakable than ceramic materials and low in thermal conductivity and that the semiconductor sensor element 2 will hardly cause thermal errors.

Figure 4:
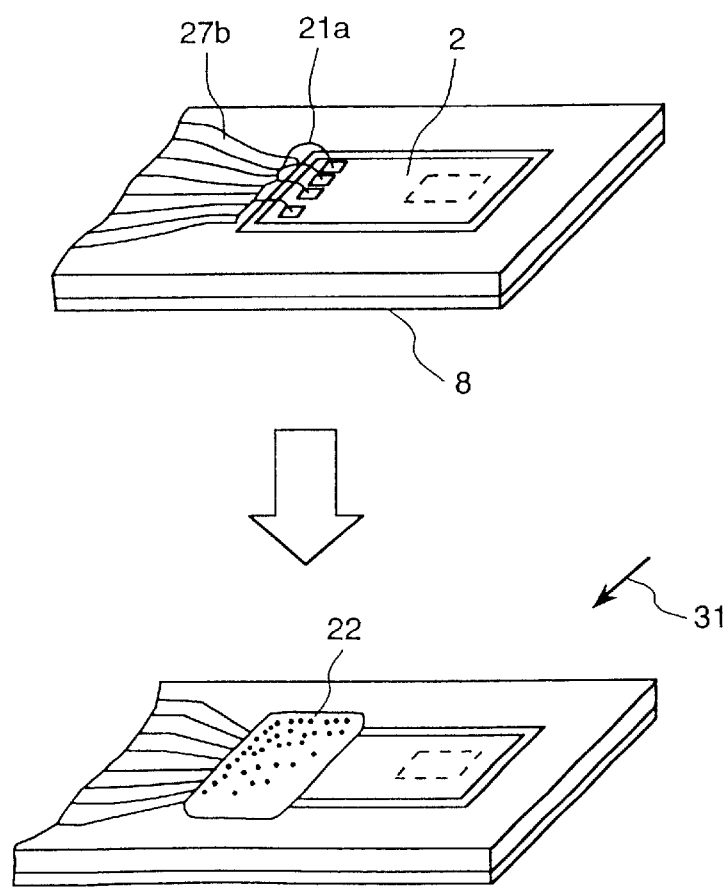
FIG. 4 is a magnified representation of the thermal airflow sensor in accordance with the present invention which has a semiconductor sensor element on the laminated board.

Below will be explained another embodiment of the present invention, referring to FIG. 4.

As already explained above, the semiconductor sensor element 2 is very small (approx. 2 mm by 6 mm by 0.3 mm). Therefore, when the semiconductor sensor element 2 is placed in the center of the subsidiary passage, the connecting wires 21a are exposed in the air flow and may be easily damaged. To avoid this, as shown in FIG. 2 of Japanese Non-examined Patent Publication No.9-503311 (1997), the electrode part 27a of the semiconductor sensor element 2 must be placed in the housing so that the connecting wire 21a may not be exposed to the air. For this reason, the thermal airflow sensor cannot be placed away from the wall of the subsidiary passage to get the flow rate of the air. The air flows slower and disturbed near the wall and the precision of measurement of the thermal airflow sensor becomes worse. Further, the thermal airflow sensor is apt to be affected by heat from the engine.

Naturally as seen from the structure of the thermal airflow sensor, the sensor cement 7 which bonds the semiconductor sensor element 2 to the laminated ceramic board 8 is also exposed to the air. If the sensor cement 7 dimensionally changes even a little bit (by corrosion, gasoline vapor in the intake pipe, or engine oil), the position of the semiconductor sensor element 2 is directly affected and its characteristics vary. Basically, the sensor cement 7 is made of silver-added epoxy resin or silver-added silicone resin. The connecting wires are fine gold wires of approximately 0.03 mm in diameter and welded ultrasonically to connect the semiconductor sensor element and the control circuit. The sensor cement highly resistant to heat and ultrasonic waves has been selected considering that the joints must be heated to about 200° C. and ultrasonically processed. However, silver in the sensor cement is apt to be corroded by corrosive gases (e.g. sulfurous gas) in the intake pipe and the silicone resin is apt to be swollen by gasoline vapor or engine oil.

To avoid the above problems, this embodiment employs a structure 22 of covering the wiring section 21a with epoxy resin to protect only the sensor cement from the surrounding air, leaving the semiconductor sensor element 2 exposed in the air flow. The feature of this structure is that the top surface of the semiconductor sensor element 2 is as high as the top surface of the laminated ceramic board and that the wire sealing can be done by printing.

In a conventional structure which has the semiconductor sensor element 2 on the surface of the board and the sensor surface is higher than the board surface, seal-printing on the wire-bonding section of the semiconductor sensor element 2 cannot be continuous. Contrarily, in the structure of the present embodiment which has the semiconductor sensor element 2 in a dent formed on the surface of the laminated board to put their surfaces in the same level, a wire sealing film 22 can be continuously printed in place on the wire-bonding section. Particularly, the shape of the sealing resin film 22 to be printed near the sensor is very significant as it directly affects the output characteristics of the sensor.

Further, air bubbles in the sealing epoxy resin may cause corrosion of the bonding wires 21a or cracks in the sealing film. The air bubbles must be removed from the sealing film preferentially by vacuuming. Further, inorganic material of a low thermal expansion coefficient such as silica is added to the epoxy resin to make the thermal expansion coefficient of the epoxy resin closer to that of silicone. After the sealing resin film 22 is printed on the bonding wires 21a, the wires are always protected against damages by involuntary contacts in the succeeding assembling steps.

Naturally, as this structure enables the wire-bonding section 21a to be placed in the intake pipe as shown in FIG. 1, the present embodiment can offer a thermal airflow sensor 1 of higher precision of measurement, high reliability, and low production cost.

Although the above embodiment uses epoxy resin for a sealing resin film 22, the same effect can be obtained also by the other material such as fluoro resin. The fluoro resin has an excellent environment resistance. Particularly, the fluoro resin is highly resistant to non-polar solvents such as gasoline and engine oil and will not swell in the presence of non-polar solvents. Further, the fluoro resin is softer than the epoxy resin and will never give stresses to the bonding wires 21a. Contrarily, the thermal airflow sensor must be treated in the succeeding assembling steps as the soft fluoro resin is not so protective as the epoxy resin.

Below will be explained the third embodiment of the present invention, referring to FIG. 5.

Figure 5:
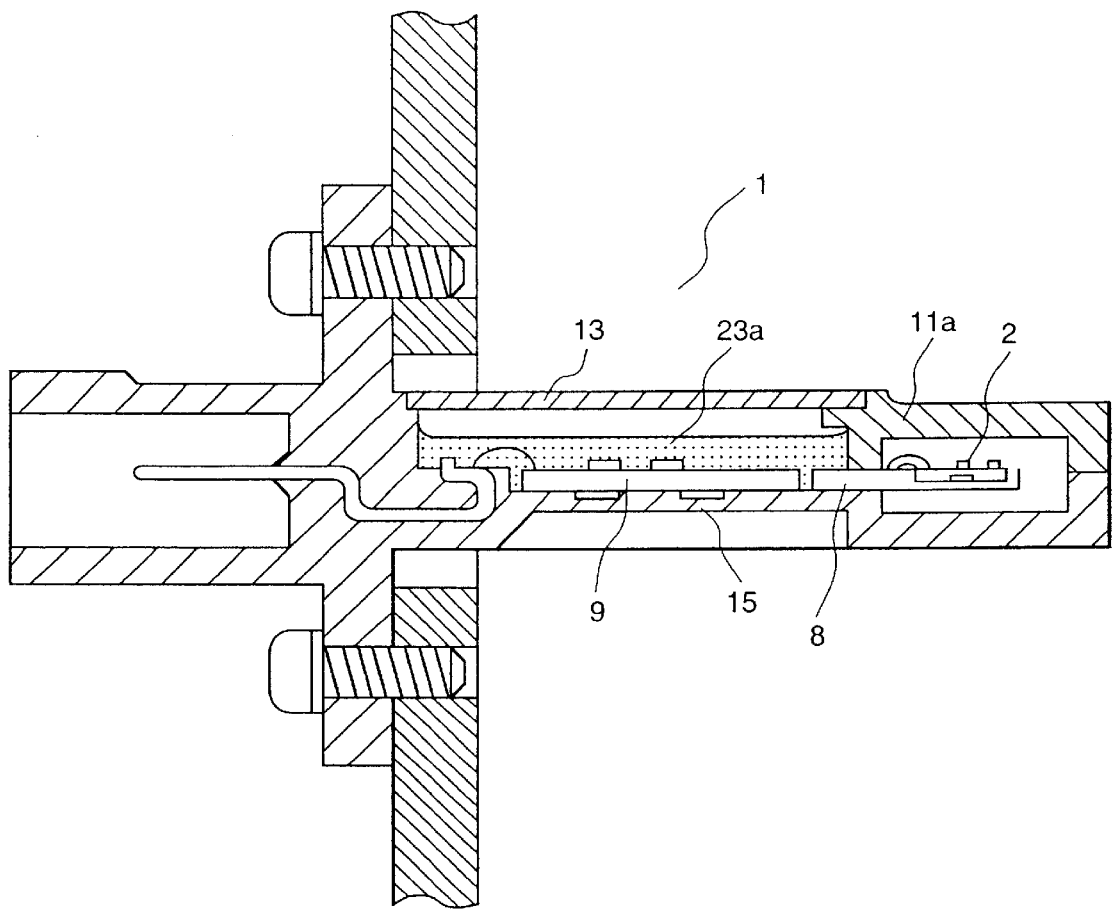
FIG. 5 is a sectional representation of the thermal airflow sensor in accordance with the present invention which has a semiconductor sensor element.

FIG. 5 shows the thermal airflow sensor having the control circuit board 9 separated from the laminated board 8 with a dent to contain the semiconductor sensor element 2. The structure of the laminated board 8 is basically the same as that of the above structure. For example, the laminated board 8 can contain a metallic shielding film (to prevent electromagnetic noises) on the top surface of the bottom or intermediate board. The major feature of this structure is that the heat from the engine will not transfer to the laminated board 8 containing the semiconductor sensor element even when the control circuit board 9 becomes hot by the engine heat. This makes the thermal airflow sensor more precise.

FIG. 6 through FIG. 10 are sectional views of the laminated boards 8a, 8b, and 8c having a semiconductor sensor element 2 in its dent to explain the other embodiments using the laminated boards 8a, 8b, and 8c.

Figure 6:
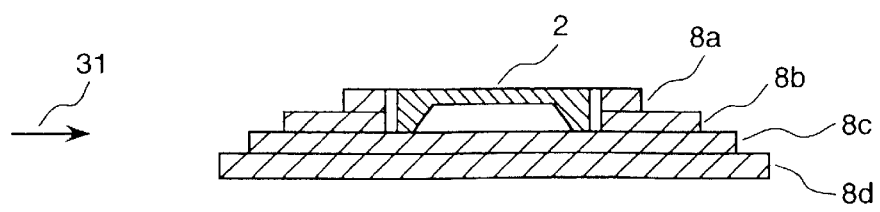
FIG. 6 is a fragmentary sectional representation of the thermal airflow sensor in accordance with the present invention which has a semiconductor sensor element on the laminated board.
Figure 7:
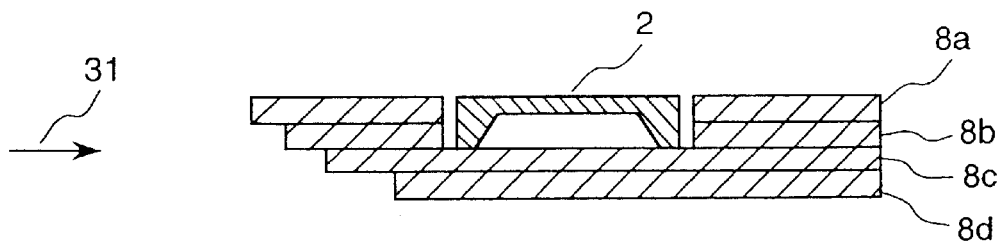
FIG. 7 is a fragmentary sectional representation of the thermal airflow sensor in accordance with the present invention which has a semiconductor sensor element on the laminated board.

The laminated boards 8a, 8b, 8c and 8d in FIG. 6 have both the upstream and downstream ends tapered step-like to the top so that the up-most board 8a may be narrowest. The laminated boards 8a, 8b, 8c and 8d in FIG. 7 have only the upstream ends tapered step-like to the top.

The resulting slopes of the laminated boards 8a, 8b, 8c and 8d are to let the air 31 flow smoothly and steadily toward the semiconductor sensor 2 without air disturbance. This can reduce output noises of the sensor. This can also make the laminated boards 8a, 8b, 8c and 8d thinner without reducing the strength of the boards and the surface area of the boards wider. Consequently, the laminated boards 8a, 8b, 8c and 8d can radiate heat (coming from the control circuit section and the housing member 15) more efficiently and can remain unaffected by heat.

This slows heat from the engine to transfer to the semiconductor sensor element 2 and the thermoresistor can measure exact temperatures. Consequently, the output characteristics of the thermal airflow sensor are assured. Of course, the same effect can be obtained by other structures than those shown in FIG. 6 and FIG. 7, for example, laminated boards in FIG. 6 having only the upstream ends sloped step-like or laminated boards in FIG. 7 having both the upstream and downstream ends sloped step-like.

Figure 8:
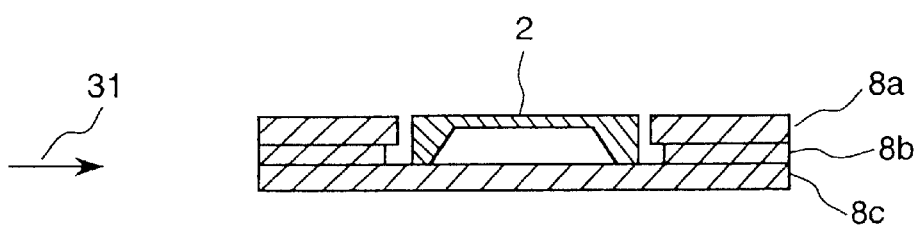
FIG. 8 is a fragmentary sectional representation of the thermal airflow sensor in accordance with the present invention which has a semiconductor sensor element on the laminated board.
Figure 9:
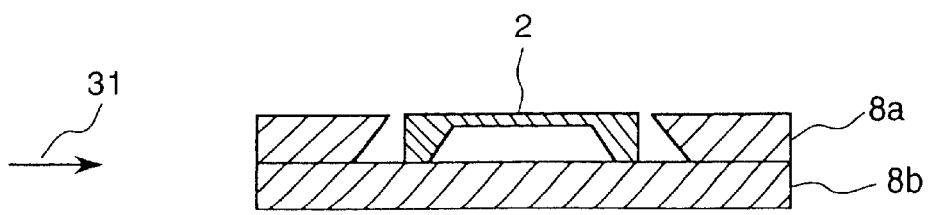
FIG. 9 is a fragmentary sectional representation of the thermal airflow sensor in accordance with the present invention which has a semiconductor sensor element on the laminated board.

FIG. 8 and FIG. 9 show the sectional views of the laminated boards 8a, 8b, and 8c having the semiconductor sensor element 2 in its dent. In each figure, the dent in the laminated board is so formed that the clearance between the semiconductor sensor element and the laminate board may be smallest on their top surfaces. A very small clearance is formed between the bottom of the semiconductor sensor element and the top surface of the bottom board under the diaphragm 6 on which the heating resistor 3 of the semiconductor sensor element 2 is mounted. When air comes into this clearance, it deprives more heat of the heating resistor 3. However, it is very difficult to provide fixed widths of this clearance as the width of this clearance is dependent upon the thickness of the sensor cement. The width of this clearance has a great influence upon the output characteristics of the thermal airflow sensor 1.

To suppress the dispersion of the output characteristics of the thermal airflow sensor 2, the clearance between the semiconductor sensor element 2 and the dent wall 8a is made smallest on the top surface of the upper board 8a perpendicularly to the direction of the airflow 31. This dent structure is effective to prevent air from entering the dent, solves the above problems, and increases the precision of the output characteristics of the thermal airflow sensor. As for the dent structure in FIG. 8, only the clearance between the semiconductor sensor element and the upper laminated board 8a must be worked precisely and the clearance between the semiconductor sensor element and the intermediate laminated board 8b need not be worked so precisely. Therefore, this structure has a better workability. When this structure is applied to the whole periphery of the dent wall 8a, less air enters the dent and consequently, the precision of the output characteristics can be increased.

This structure will also present the effect explained below. The empty space (cavity) in this structure will take in excessive sensor cement 7 which bonds the semiconductor sensor element 2 to the surface of the laminated board 8 without letting the sensor cement invade the electrode section 27a. This will simplify the cementing job.

Figure 10:
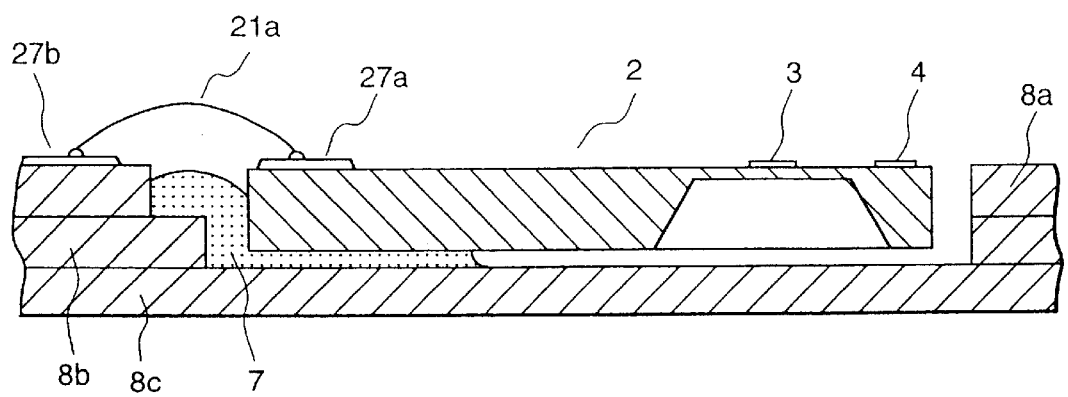
FIG. 10 is a fragmentary sectional representation of the thermal airflow sensor in accordance with the present invention which has a semiconductor sensor element on the laminated board.

The structures shown in FIG. 6 through FIG. 9 and the structure in FIG. 10 to be explained below are all adopted using the features that boards of desired shapes can be easily piled up to form a laminated board having a dent and that the laminated boards are very cheap.

The fourth embodiment of the present invention will be explained below referring to FIG. 10. FIG. 10 is a fragmentary sectional view of the semiconductor sensor element 2 which is bonded to the dent of the laminated boards 8a, 8b, and 8c and connected to the control circuit by wires 21a. The sensor cement 7 is applied to the bottom of the semiconductor sensor element just under the electrode 27a to prevent the electrodes 27a and 27b from resonating when wires 21a are ultrasonically welded.

A lot of semiconductor sensor elements were test-bonded in preparation for mass-production. If the quantity of sensor cement 7 goes over an optimum quantity, the excessive sensor cement 7 moves up the clearance between the dent wall and the semiconductor sensor element, finally spreads out over the surface of the upper laminated board and the top surface of the semiconductor sensor element. In extreme cases, the sensor cement may cover the electrode 27a of the semiconductor sensor element 2, the electrode 27b of the laminated board, or both. The sensor cement on electrodes makes incomplete wire bonding or disables wire bonding.

To prevent the electrodes from being covered with sensor cement, the upper clearance (between the upper laminated board 8a and the semiconductor sensor element) is made wider and the lower clearance (between the intermediate laminated board 8b and the semiconductor sensor element) is made narrower. This structure lets a small amount of excessive sensor cement to move up and prevents the sensor cement from going up further to the electrode surfaces 27a and 27b. With this structure, the thermal airflow sensors are free from bonding troubles.

Further in accordance with this embodiment, as the lower clearance between the intermediate laminated board 8b and the semiconductor sensor element 2 is very narrow, the sensor can be positioned so precisely. This eliminates dispersions in the output characteristics and increases the precision of measurement.

The fifth embodiment of the present invention will be explained below referring to FIG. 11 through FIG. 15.

Figure 11:
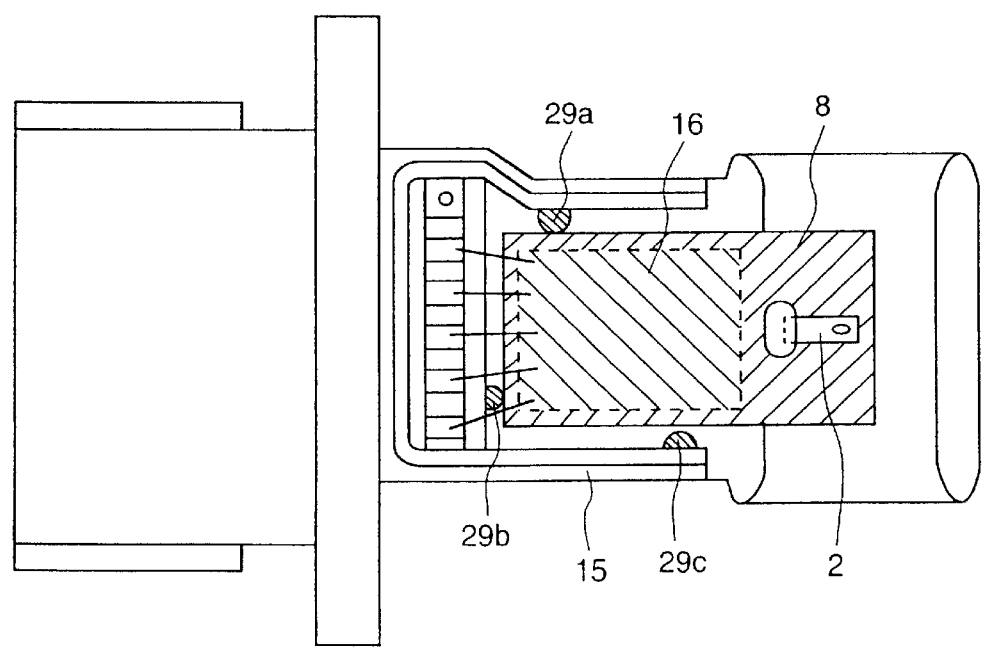
FIG. 11 is a fragmentary sectional representation of the thermal airflow sensor in accordance with the present invention which has a semiconductor sensor element on the laminated board.

FIG. 11 is a plane view of the thermal airflow sensor mounted on the housing 15 without the cover and the subsidiary passage 11a of the embodiment shown in FIG. 1. This figure does not contain electric parts 23a and 23b and the circuit pattern printed on the laminated board. This structure having the semiconductor sensor element 2 in the laminate board 8 are equipped with three board supporting members 29a, 29b, and 29c for assurance of high positional precision. If the board supporting members 29a, 29b, and 29c are formed in the subsidiary passage to position the right side of the laminated board, they may disturb the air flow, cause the output characteristics to disperse, or increase the output noises. To solve this problem, the upper and lower right corners of the laminated board (where the semiconductor sensor element 22 is mounted) are cut off to make the sensor area narrower than the remaining part of the laminated board (where the control circuit 16 is mounted) as shown in FIG. 12.

In accordance with this embodiment, the positioning precision of the laminated board increased and consequently, the semiconductor sensor element can always be positioned correctly in the subsidiary passage. This can reduce the dispersion of the output characteristics and increase the precision. This also has an effect to limit heat transfer from the control circuit area to the sensor area on the laminated board. Substantially, this structure can block engine heat transferring to the semiconductor sensor element 2 through the control circuit area 16 on the laminated board. Further, this structure blocks the heat generated in the control circuit from transferring to the semiconductor sensor element 2. This can reduce the errors in the output characteristics.

However, the above structure having two cut-offs in the semiconductor sensor element area of the laminated board is apt to collectively receive stresses at the left boarder of the semiconductor sensor element area. An excessive handling force on the semiconductor sensor element area will cause cracks there. Further, vibrations and heat cycles on the thermal airflow sensor 1 will also cause cracks at the left boarder of the semiconductor sensor element area. FIG. 13 shows an embodiment to solve this problem. This embodiment cuts off only one corner of the semiconductor sensor element area of the laminated board. This structure having one cut-off is stronger than the structure having two cut-offs and the possibility to have cracks at the left boarder of the semiconductor sensor element area is smaller. The other effects of this structure are the same as those of the structure shown in FIG. 12.

Figure 12:
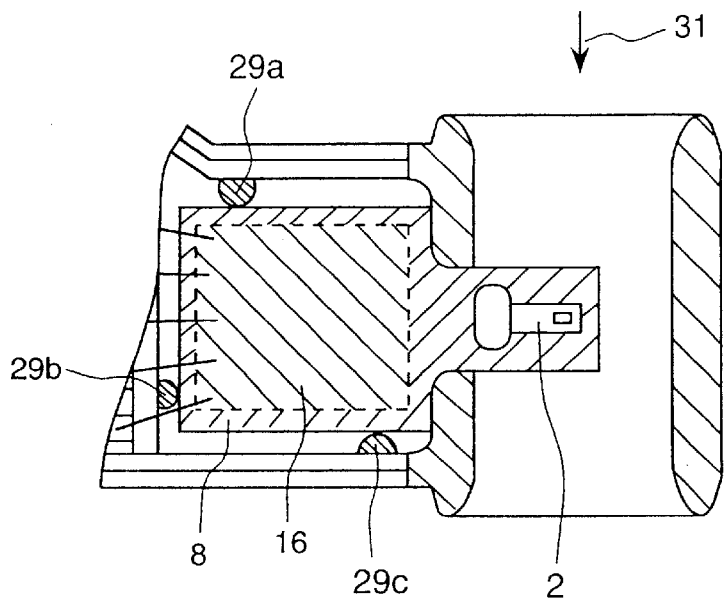
FIG. 12 is a fragmentary sectional representation of the thermal airflow sensor in accordance with the present invention which has a semiconductor sensor element on the laminated board.
Figure 13:
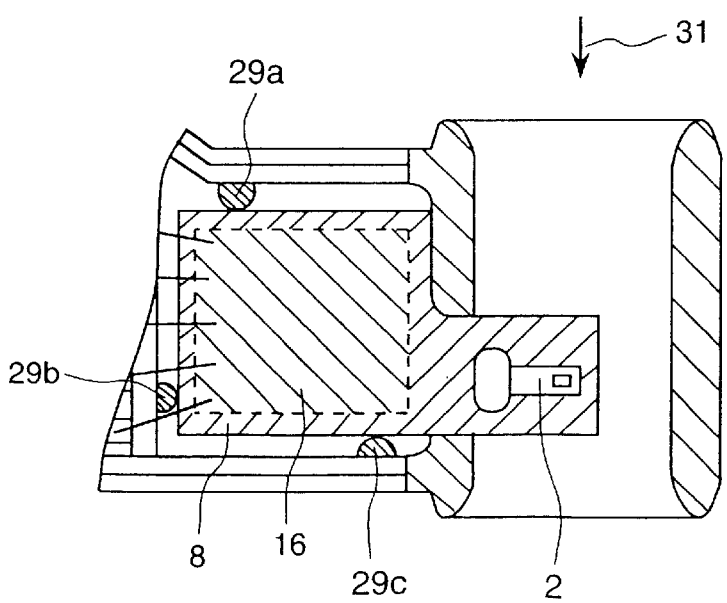
FIG. 13 is a fragmentary sectional representation of the thermal airflow sensor in accordance with the present invention which has a semiconductor sensor element on the laminated board.
Figure 14:
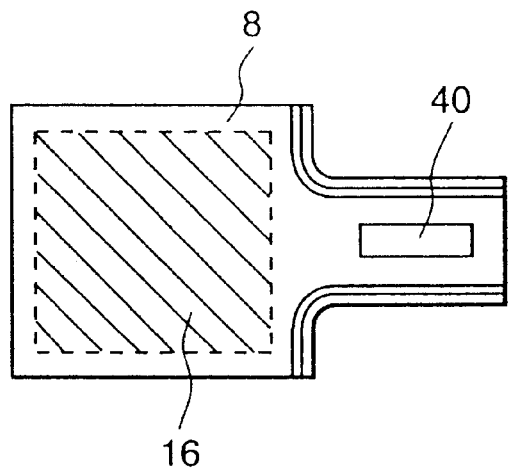
FIG. 14 is a front view of the laminated board of the thermal airflow sensor in accordance with the present invention which has a semiconductor sensor element on the laminated board.
Figure 15:
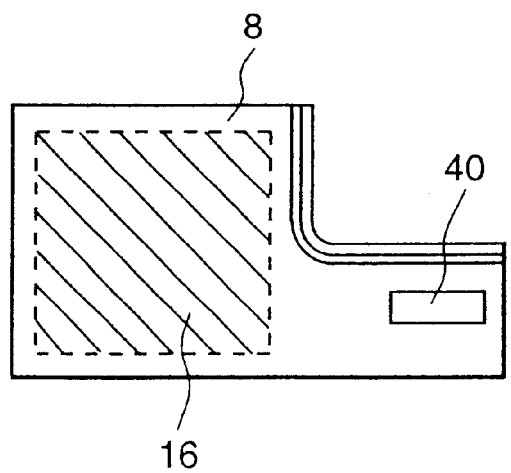
FIG. 15 is a front view of the laminated board of the thermal airflow sensor in accordance with the present invention which has a semiconductor sensor element on the laminated board.

FIG. 14 and FIG. 15 shows embodiments which have means to suppress generation of cracks at the left boarder of the semiconductor sensor element area of the laminated board (which are explained referring to FIG. 12 and FIG. 13). Substantially, the cut-off parts of the laminated board 8 are formed step-like to decentralize the stresses on the laminated board and prevents any crack on a laminated board from propagating further to the other laminated board.

The sixth embodiment of the present invention will be explained below referring to FIG. 16 and FIG. 17.

Figure 16:
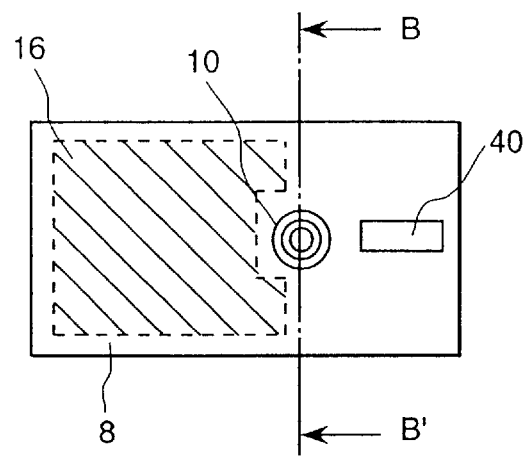
FIG. 16 is a front view of the laminated board of the thermal airflow sensor in accordance with the present invention which has a semiconductor sensor element on the laminated board.
Figure 17:
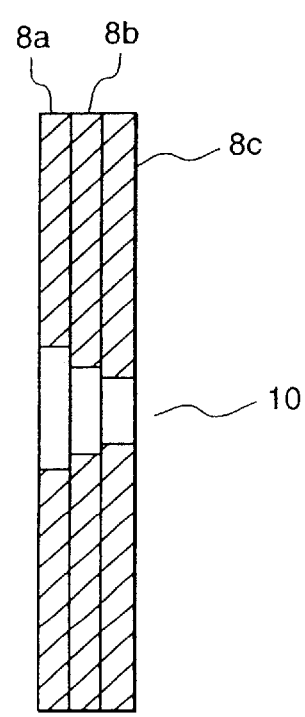
FIG. 17 is a sectional view of the laminated board of the thermal airflow sensor in accordance with the present invention which has a semiconductor sensor element on the laminated board.

FIG. 16 shows an embodiment having a stepped through hole in the center of the boundary between the control circuit area and the semiconductor sensor element area of the laminated board. This stepped through-hole works to position the laminated board in place in the housing and to thermally isolate the semiconductor sensor element 2 from the control circuit 16. FIG. 17 is a magnified view of the stepped through-hole 10 along the line B–B'. The through-hole 10 of this embodiment is preferentially stepped as shown in FIG. 16 and FIG. 17 to reduce the possibility of having cracks. However, the through-hole can have the other shape. The other effects of this embodiment are almost the same as those of embodiments explained referring to FIG. 11 through FIG. 15.

One of the major features of the thermal airflow sensor 1 which uses a semiconductor sensor element 2 is low power consumption and quick response as the diaphragm 6 on which a heating resistor 3 is mounted can be made extremely small and thin. Contrarily, the demerit of the thermal airflow sensor 1 is that the sensor is too small and that a little bit of a foreign object on the surface of the sensor will disturb the airflow on the surface of the sensor and change the heat transfer rate of the sensor. Further, we found that, if the laminated board having the semiconductor sensor element 2 is contaminated even when the semiconductor sensor element 2 is not stained, the airflow on the sensor is disturbed and the output characteristics of the sensor varies.

Figure 18:
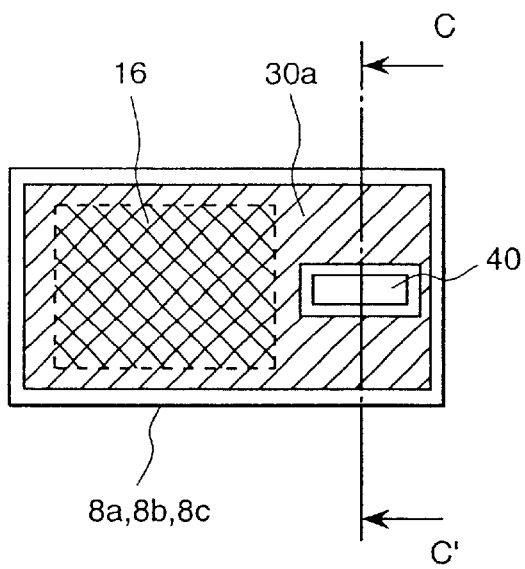
FIG. 18 is a front view of the laminated board of the thermal airflow sensor in accordance with the present invention which has a semiconductor sensor element on the laminated board.
Figure 19:
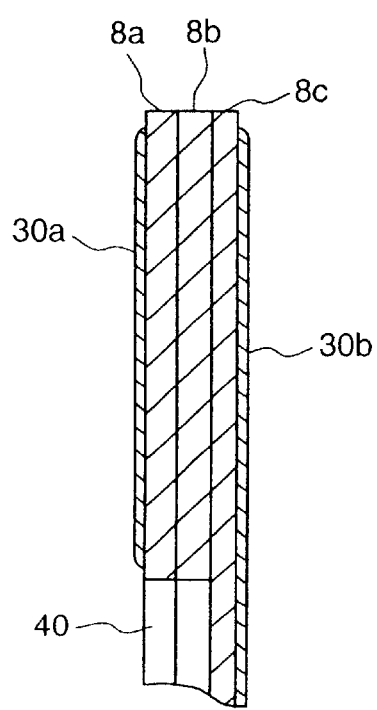
FIG. 19 is a sectional view of the laminated board of the thermal airflow sensor in accordance with the present invention which has a semiconductor sensor element on the laminated board.

FIG. 18 and FIG. 19 show another embodiment to prevent this problem or to keep the surface of the sensor and the surface of the laminated board clean. FIG. 18 is a plane view of the laminated board 8a, 8b, and 8c having a dent in it. The surface of the laminated board is covered with a film of glass. The semiconductor sensor element 2, electric parts 23a, and others on the laminated board 8a, 8b, and 8c are invisible in this figure. FIG. 19 is a fragmentary magnified view taken on line C–C' of FIG. 18. Below will be explained the details of this embodiment.

The laminated boards 8a, 8b, and 8c of this embodiment are made of ceramic materials such as aluminum or a mixture of aluminum and glass to increase the heat resistance of the laminated board and make the thermal expansion coefficient of the laminated board approximately equal to that of glass. Both top and bottom surfaces of the laminated board excluding the semiconductor sensor element 2 area which is placed in the subsidiary passage are covered with glass films 30a and 30b. The glass films on the laminated board make the surfaces of the laminated board smooth and prevent the surfaces from being contaminated. This increases the resistance of the laminated board to contamination.

Further, the glass films 30a and 30b eliminate fine dents and projections on the surfaces of the laminated boards 8a and 8c, make the laminated board stronger, and suppresses generation of cracks in the laminated boards. Furthermore, the smooth glass surfaces reduce disturbance of airflow and output noises of the sensor. Although the laminated board in FIG. 19 has a glass film 30a and 30b on both top and bottom surfaces 8a and 8c of the laminated board, only the board surface including the semiconductor sensor element can be covered with a glass film. In this case, although the bottom surface of the laminated board will be contaminated, the sensor characteristics will not be affected so much.

Further as the glass film 30a and 30b can be applied to the surface(s) of the laminated board by a single-glass coating step which applies a glass film to protect the circuit pattern of the control circuit 16, the production cost of the thermal airflow sensors does not increase. Therefore, the structure of this embodiment can offer inexpensive thermal airflow sensors of high contamination resistance, low output noises, and high reliability (due to glass which reinforces the board).

Although the embodiment in FIG. 18 and FIG. 19 explains a laminated board having the control circuit 16 and the semiconductor sensor element 2 together on the board, the same effect can be obtained by coating only the laminated board having the semiconductor sensor element 2 with a glass film 30a or 30b.

Below will be explained an example of applying the thermal airflow sensor 1 having a plate-like heating resistor 3 in accordance with the present invention, referring to FIG. 20 and FIG. 21. It is well known that the thermal airflow sensor 1 having a plate-like heating resistor 3 must reduce the heat capacity of the sensor section as much as possible to quicken the response. For this purpose, the heating resistor plate is usually made as thin as possible or as narrow as possible if the practical strength permits. However, the heating resistor plate cannot be thinner than the limit. Further, narrower heating resistor plates are mounted less precisely and similarly the heating resistor plate cannot be narrower than the limit. As such limitations exist, the response of the conventional plate-like heating resistor cannot be faster than that of semiconductor sensor element.

So the present invention has devised means for offering high-response thermal airflow sensors exceeding such designing limits.

Figure 20:
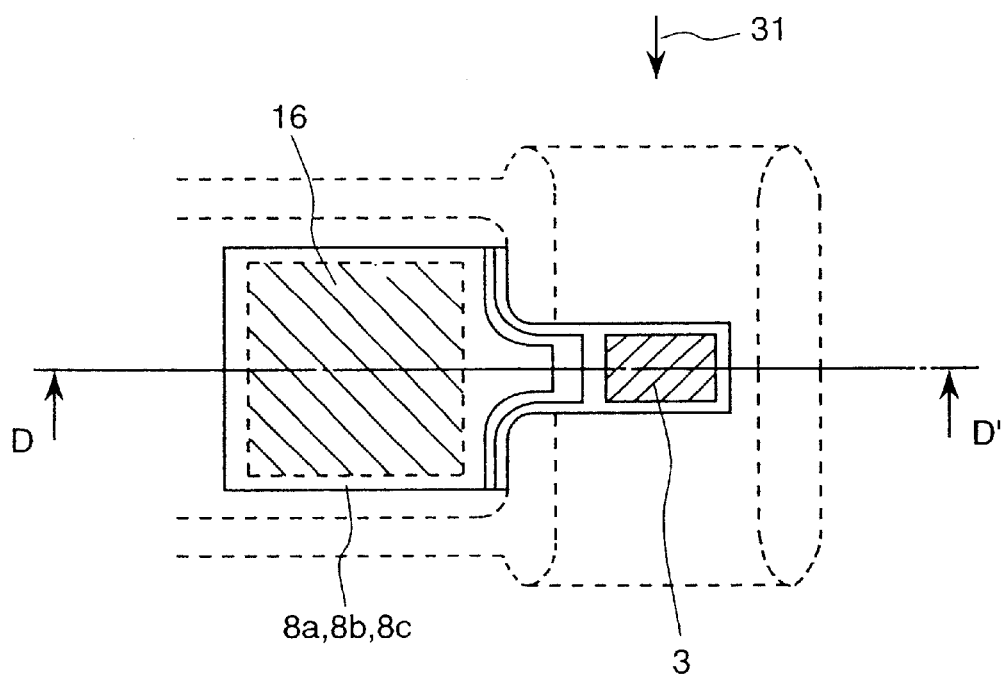
FIG. 20 is a front structural view of the laminated board of the thermal airflow sensor in accordance with the present invention which has a heating resistor on the laminated board.
Figure 21:
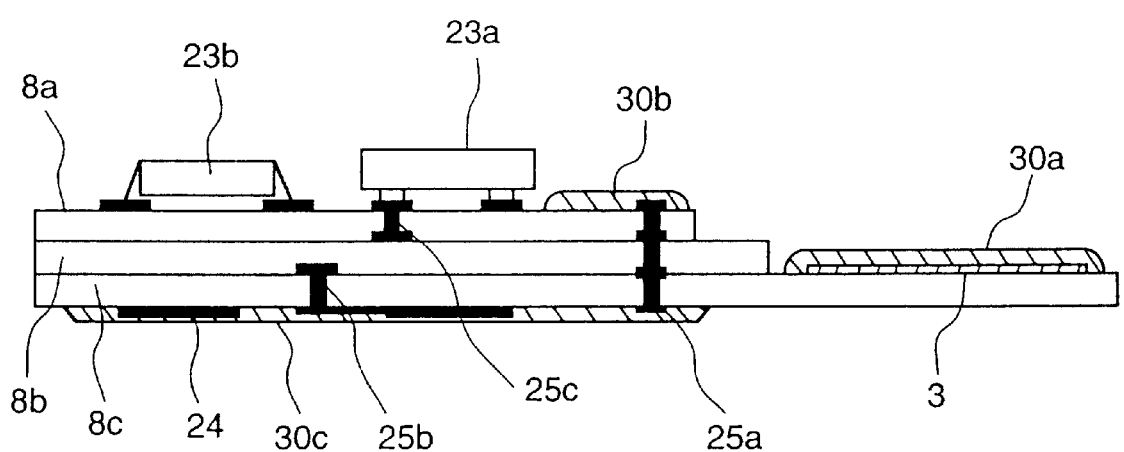
FIG. 21 is a sectional view of the laminated board of the thermal airflow sensor in accordance with the present invention which has a heating resistor on the laminated board.

FIG. 20 is a plane view of a plate-like thermal airflow sensor 1 having a control circuit 16 and a heating resistor element 3 together on a laminated board 8a, 8b, and 8c. The number of laminated boards having the heating resistor element 3 is less than the number of laminated boards having the control circuit so that the sensor section may be thinner. In FIG. 20, the passage, electric parts, and the circuit pattern are invisible because they are not required for explanation. FIG. 21 is a sectional magnified view taken on the line D–D' in FIG. 20, excluding the passage.

The laminated boards 8a, 8b, and 8c of this embodiment are made of ceramic materials such as aluminum or a mixture of aluminum and glass. The heating resistor 3 comprises a heater pattern made of a metallic material of a high resistance-temperature coefficient such as a platinum or nickel film. The heat capacitance of the heating resistor section 3 which is the sensor section to be placed in the airflow 31 can be made smaller by making the number of laminated boards for the sensor section less than the number of laminated boards for the control circuit section. As the number of laminated boards of this embodiment increases towards the control circuit 16, the sensor section is hard to be broken by external forces even when the sensor section is made as thin as possible. Further, even when the sensor plate is made narrower, the sensor element can be positioned precisely as the control circuit section is wide enough to be handled. Furthermore, as the heating resistor 3 and the control circuit 16 can be connected by circuit-pattern printing, no bonding wire 21a is required to connect them. Therefore, the structure of this embodiment can offer thermal airflow sensors 1 of high response, low characteristic dispersion, and high reliability.

Although the above embodiment explains the laminated board having both the control circuit 16 and the heating resistor element 3 on the board, the same effect can be obtained by applying this structure only to the heating resistor 3. In such a case, wires 21a are required to connect the heating resistor 3 and the control circuit 16. However, this structure has features that the heat generated by the heating resistor element 3 is hard to be transferred to the control circuit 16 and that the heat generated by the control circuit 16 is hard to be transferred to the semiconductor sensor element 3.

Although the laminated boards shown in FIG. 1 through FIG. 21 are made of two, three, or four boards, the present invention does not limit the number of boards in each drawing. For. example, the same effect can be obtained by replacing an embodiment comprising two boards by an embodiment comprising five boards.

The present invention can offer high-reliability thermal airflow sensors which is highly resistant to heat stresses due to cold-hot cycles and whose characteristics will hardly change even under a severe environmental conditions such as in an engine room. Further, the present invention can reduce the number of parts to be assembled, make the sensor body compacter, and reduce the cost of production (due to good assembling ability). Furthermore, the thermal airflow sensor in accordance with the present invention can be placed in the subsidiary passage away from its wall. This can reduce the output noises and characteristic dispersions.

What is claimed is:

1. A thermal airflow sensor comprising:
   a semiconductor sensor having a measuring part with a thermo resistor and a heating resistor formed on a semiconductor board, said semiconductor board being disposed in a dent formed on a board composed of ceramic laminated boards, and a control circuit electrically connected to said thermo resistor and said heating resistor, said control circuit being formed on said board.

2. A thermal airflow sensor in accordance with claim 1, wherein the dent in said laminated board is prepared by piling up punched boards and non-punched boards.

3. A thermal airflow sensor in accordance with claim 1 wherein a metallic layer is formed on the surface or inside of said laminated boards, wherein said laminated boards are made of ceramic materials such as alumina or a mixture of alumina and glass.

4. A thermal airflow sensor in accordance with claim 1, wherein a circuit pattern for electrically connecting said semiconductor sensor element and said laminated boards is formed on the surface or inside of said laminated boards, wherein said laminated boards are made of ceramic materials such as aluminum or a mixture of aluminum and glass.

5. A thermal airflow sensor in accordance with claim 1, wherein the area at which said semiconductor sensor element is connected to said laminated boards is hermetically covered with a protective resin film, and at least part of said resin film is placed in a passage.

6. A thermal airflow sensor in accordance with claim 5, wherein said protective resin film is made of epoxy or fluoro resin.

7. A thermal airflow sensor in accordance with claim 1, wherein the area at which said semiconductor sensor element is bonded to said laminated boards by cement and an electrical joint part are hermetically covered with a protective resin film, and at least part of said resin film is placed in a passage to be in direct contact with a flow of fluid whose flow rate is to be measured.

8. A thermal airflow sensor in accordance with claim 1, wherein the control circuit controls the intensity of a current to said heating resistor to make said heating resistor hotter by a preset temperature than said thermoresistor and to which an airflow signal is input indicating the flowrate of air, wherein said laminated boards are made of ceramic materials such as alumina or a mixture of alumina and glass.

9. A thermal airflow sensor in accordance with claim 8, wherein the outer surface of said laminated board is covered with a glass film, and the glass film is placed in a passage to be in direct contact with a flow of fluid whose flow rate is to be measured.

10. A thermal airflow sensor in accordance with claim 1, wherein the control circuit controls the intensity of a current to said heating resistor to make said heating resistor hotter by a preset temperature than said thermoresistor and to which an airflow signal is input indicating the flowrate of air, wherein said laminated boards are made of resin materials prepared by impregnating polyimide resin with epoxy resin.

11. A thermal airflow sensor in accordance with claim 1, wherein upstream end or up- and down-stream ends of said laminated boards are sloped step-like.

12. A thermal airflow sensor in accordance with claim 1, wherein an up-most end of the dent in said laminated boards which contains said semiconductor sensor element is narrowed.

13. A thermal airflow sensor in accordance with claim 1, wherein the sensor and control circuit are electrically connected and an up-most end of the dent near the electrode formed on said laminated board is widened.

14. A thermal airflow sensor in accordance with claim 1, wherein the laminated board area including said semiconductor sensor element is narrower and the laminated board area including said control circuit is wider.

15. A thermal airflow sensor in accordance with claim 1, wherein said laminated boards contain a bent part and an end of the bent part is sloped step-like.

16. A thermal airflow sensor in accordance with claim 1, wherein a through-hole is provided between an area of the semiconductor sensor and an area of the control circuit on said laminated boards.

17. A thermal airflow sensor in accordance with claim 1, wherein said heating resistor is a thin-film resistor to which a circuit pattern is connected, said thin-film resistor and said circuit pattern being formed on the surface of the laminated boards; the number of laminated boards for the thin-film resistor is less than the number of laminated boards for the circuit pattern; and an area of the laminated boards for the thin-film resistor is narrowed.

18. A thermal flow sensor in accordance with claim 1, wherein a metallic layer is formed on the surface or inside of said laminated boards, wherein said laminated boards are made of resin materials prepared by impregnating polyimide resin with epoxy resin.

19. A thermal flow sensor in accordance with claim 1, wherein a circuit pattern for electrically connecting said semiconductor sensor element and said laminated boards is formed on the surface or inside of said laminated boards, wherein said laminated boards are made of resin materials prepared by impregnating polyimide resin with epoxy resin.

* * * * *